(12) United States Patent
Mizumura et al.

(10) Patent No.: US 7,394,327 B2
(45) Date of Patent: Jul. 1, 2008

(54) SURFACE MOUNT TYPE TEMPERATURE-COMPENSATED CRYSTAL OSCILLATOR

(75) Inventors: Hiroaki Mizumura, Sayama (JP); Kouichi Moriya, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 83 days.

(21) Appl. No.: 11/540,684

(22) Filed: Oct. 2, 2006

(65) Prior Publication Data

US 2007/0075796 A1     Apr. 5, 2007

(30) Foreign Application Priority Data

Sep. 30, 2005     (JP)     ............... 2005-287839

(51) Int. Cl.
*H03B 1/00*     (2006.01)
*H03B 5/36*     (2006.01)
*H03L 1/02*     (2006.01)

(52) U.S. Cl. ..................... 331/158; 331/68; 331/69; 331/108 D; 331/176

(58) Field of Classification Search ............ 331/68–70, 331/108 D, 116 R, 116 FE, 158, 159, 176
See application file for complete search history.

(56) References Cited

U.S. PATENT DOCUMENTS 6,229,249 B1 *    5/2001    Hatanaka et al. ............ 310/348

2006/0055478 A1    3/2006    Isimaru

FOREIGN PATENT DOCUMENTS

JP       2003-204221 A       7/2003

* cited by examiner

*Primary Examiner*—David Mis
(74) *Attorney, Agent, or Firm*—Fitch, Even, Tabin & Flannery

(57) ABSTRACT

A surface mount type temperature-compensated crystal oscillator includes a crystal blank; an IC chip integrating an oscillation circuit using the crystal blank and a temperature compensation mechanism of compensating frequency temperature characteristics of the crystal blank; and a substantially rectangular parallelepiped container body for surface mounting having a first recess of housing the crystal blank and a second recess of housing the IC chip. Respective side surfaces corresponding to the long sides of the container body are provided with crystal inspection terminals for inspecting oscillation characteristics of the crystal blank and respective side surfaces corresponding to the short sides are provided with data writing terminals for writing temperature compensation data to the temperature compensation mechanism. A conductive path electrically connecting the IC chip to the crystal inspection terminal is formed to be shorter than a conductive path electrically connecting the IC chip to the data writing terminal.

3 Claims, 3 Drawing Sheets

US 7,394,327 B2

SURFACE MOUNT TYPE TEMPERATURE-COMPENSATED CRYSTAL OSCILLATOR

This Application is a U.S. Utility Patent Application which claims foreign priority from Japanese Patent Application No. 2005-287839, filed Sep. 30, 2005, the complete disclosure of which is incorporated herein by reference.

BACKGROUND OF THE INVENTION

1. Field of the Invention

The present invention relates to a temperature-compensated crystal oscillator in which a crystal unit, an oscillation circuit using the crystal unit and a temperature compensation mechanism for compensating frequency-temperature characteristics of the crystal unit are housed inside a container for surface mounting, and more particularly, to a temperature-compensated crystal oscillator having a data writing terminal for writing temperature compensation data into the temperature compensation mechanism and a crystal inspection terminal for carrying out an operation test of the crystal unit.

2. Description of the Related Arts

For its small size and lightweight as well as high stability of an oscillating frequency against a temperature change, a temperature-compensated quartz crystal oscillator of a surface mount type is widely used as a reference source for a frequency and time, in particular, in a portable electronic apparatus such as a cellular phone. As such a portable electronic apparatus has become smaller in recent years, there is also a need for a smaller surface-mount type temperature-compensated crystal oscillator.

FIG. 1A is a partially sectional front elevation view showing an example of a configuration of a conventional temperature-compensated crystal oscillator of a surface mount type. The illustrated crystal oscillator consists of container body 1, IC (integrated circuit) chip 6 and quartz crystal blank 8. Container body 1 has a flat, substantially rectangular parallelepiped outside shape having short sides and long sides when mounted on a wiring board and viewed from above, and is provided with recesses 20a and 20b on an upper side and a lower side thereof, respectively, resulting in a sectional shape of the letter H. Such container body 1 consists of a laminated ceramic having center layer 1a and frame walls 1b and 1c. Center layer 1a is substantially rectangular and both of frame walls 1b and 1c are frames in shape along the outer circumference of center layer 1a, and respectively laminated onto an upper side and the lower side of center layer 1a. First recess 20a shown on an upper side of the drawing is formed by center layer 1a and frame wall 1b, and second recess 20b shown on a lower side of the drawing is formed by center layer 1a and frame wall 1c. As will be described later, crystal blank 8 which functions as a crystal unit is accommodated in first recess 20a, and IC chip 6 integrating an oscillation circuit and a temperature compensation mechanism is accommodated in second recess 20b.

FIG. 1A depicts portions of recesses 20a and 20b in a sectional view and center layer 1a is shown in its end face. In addition, FIG. 1B shows a bottom view of center layer 1a alone, showing the back side of center layer 1a, that is, the surface of the party facing second portion 20b. Here, a crystal oscillator described here is a so-called two-room type where a crystal blank and an IC chip are accommodated in different recesses, that is, chambers; beside that, however, there exists a one-room type crystal oscillator where a crystal blank and an IC chip are sealed and enveloped into a same space of a container body. In addition, in general, a crystal blank housed inside a container is referred to as a crystal unit.

On a side surface of container body 1, where corresponds to an end face of center layer 1a, there are provided four data writing terminals 2a to 2d for writing temperature compensation data into the temperature compensation mechanism. Data writing terminals 2a to 2d are arranged so that two of them are provided on each long side of substantially rectangular center layer 1a. In container body 1, mounting electrode 3 used to surface-mount the crystal oscillator on a wiring board is formed in four corners of frame wall 1c forming second recess 20b. The four mounting electrodes provided are a power supply terminal (Vcc), a grounding terminal (E), an output terminal (fo) where oscillation outputs appear and an automatic frequency control terminal (AFC) where automatic frequency control signals are supplied.

On a bottom surface of second recess 20b of container body 1, that is, on the back side of center layer 1a, a plurality of circuit terminals 4 are arranged along the both long sides of center layer 1a, as shown in FIG. 1B. In the drawing, although dashed-dotted lines show the location where IC chip 6 is arranged, each circuit terminal 4 is to be provided corresponding to each of IC terminals to be provided in IC chip 6 as described later. In the drawing, five circuit terminals 4 are provided in a row along each long side. Total of four circuit terminals 4 provided in ends of each row, in other words, respective circuit terminals 4 provided at four corners are a power supply terminal (Vcc), a grounding terminal (E), an output terminal (fo) and an automatic frequency control terminal (AFC), respectively, and are electrically connected to corresponding mounting electrodes 3 by conductive paths 5 each formed in a straight line on center layer 1a. On each row of the circuit terminals, the circuit terminals at the center of the rows are crystal circuit terminals 4×1, 4×2 electrically connected to crystal blank 8 as described below. Remaining six circuit terminals excluding circuit terminals 4 corresponding to mounting electrodes 3 and crystal circuit terminals 4×1, 4×2 are writing circuit terminals 4a to 4d and are provided two for each of the rows. Writing circuit terminals 4a to 4d are electrically connected to data writing terminals 2a to 2d, respectively, by straight conductive paths 5 provided on the back side of center layer 1a.

Moreover, a pair of crystal inspection terminals X1, X2 are provided on the back side of center layer 1a. Crystal inspection terminals X1, X2 are electrically connected to crystal circuit terminals 4×1, 4×2 respectively, by straight conductive paths 5 provided on the back side of center layer 1a.

IC chip 6 is substantially rectangular and has an oscillation circuit using crystal blank 8 and a temperature compensation mechanism for compensating frequency temperature characteristics of crystal blank 8 which are integrated on a semiconductor substrate. These oscillation circuit and temperature compensation mechanism are formed on one main surface of a semiconductor substrate through a general semiconductor device fabrication process. Therefore, one of the two main surfaces of IC chip 6 on which the oscillation circuit and the temperature compensation mechanism are formed in the semiconductor substrate will be referred to as a circuit forming surface.

A plurality of IC terminals 7 are arranged on the circuit forming surface along the both long sides of the circuit forming surface. Each of IC terminals 7 corresponds to each of circuit terminals 4 on center layer 1a of container body 1. IC terminals 7 are electrically connected to a circuit inside IC chip 6. FIG. 2A illustrates an arrangement of IC terminals 7 and is a perspective view of IC chip 6 viewed from the opposite side of the circuit forming surface in order to clarify the correspondence with circuit terminal 4. Among arranged IC terminals, the IC terminals arranged at four corners are a power supply (Vcc) terminal and a grounding (E) terminal for supplying IC chip 6 with electric power, an output (fo) terminal where oscillation outputs from an oscillation circuit appear, and an automatic frequency control (AFC) terminal for supplying the oscillation circuit with an automatic frequency control signal. Two of the remaining six IC terminals are crystal IC terminals 7×1, 7×2 and other four of them are IC terminals 7a to 7d. Crystal IC terminals 7×1, 7×2 correspond to crystal circuit terminals 4×1, 4×2 of center layer 1a, respectively, and are used to electrically connect to the oscillation circuit inside IC chip 6 so that crystal blank 8 is incorporated electrically inside an oscillation closed loop of the oscillation circuit. Writing IC terminals 7a to 7d correspond to writing circuit terminals 4a to 4d of center layer 1a, respectively, and are electrically connected to the temperature compensation mechanism inside IC chip 6 and used to write the temperature compensation data to the temperature compensation mechanism.

Each IC terminal 4 is fixed onto circuit terminal 7 of center layer 1a by flip chip bonding, for example, ultrasonic thermal compression bonding by means of bump 18. In this way, IC chip 6 will be secured onto the bottom surface of second recess 20b of container body 1 so that IC chip 6 is housed inside recess 20b. At that time, the longitudinal direction of IC chip 6 corresponds with the longitudinal direction of center layer 1a.

Crystal blank 8 made of a substantially rectangular AT-cut quartz crystal blank, for example, as shown in FIG. 2B, and excitation electrodes 9 are formed on the both main surfaces of crystal blank 8, respectively. Extending electrodes 10a, 10b extend toward the both sides of an end of crystal blank 8 from a pair of excitation electrodes 9. On a bottom surface of first recess 20a, that is, on the front side of center layer 1a, a pair of crystal retaining terminals (not shown) is provided. The pair of crystal retaining terminals is electrically connected to crystal circuit terminals 7×1, 7×2 by conductive paths (not shown) provided inside center layer 1a. Crystal blank 8 will be fixed and held inside first recess 20a by fixing a pair of extending electrodes 10a, 10b onto the crystal retaining terminals, respectively, with, for example, conductive adhesive and the like in a location where these extending electrodes are led out. In addition, by fixing crystal blank 8 with conductive adhesive and the like, crystal blank 8 will be electrically connected to the oscillation circuit inside IC chip 6 and be incorporated inside the oscillation closed loop.

After crystal chip 8 has been fixed, metal cover 11 is joined to opening side of first recess 20a of container body 1 by applying seam welding or the like so that crystal chip 8 will be hermetically sealed in first recess 20a.

In fabricating such a surface mount type temperature-compensated crystal oscillator, crystal blank 8 is first hermetically sealed in first recess 20a to configure a crystal unit, and thereafter, oscillation characteristics, such as crystal impedance (CI), of crystal blank 8 as a crystal unit such are measured with a pair of crystal inspection terminals X1, X2 provided on the bottom surface of second recess 20b, that is, on the back side of center layer 1a. Specifically, a measurement probe is brought into contact with crystal inspection terminals X1, X2 to measure the oscillation characteristics. Those determined to be out of standards in oscillation characteristics is discarded as defective products, and for those determined to be good products, IC chip 6 is fixed onto the bottom surface of second recess 20b and temperature compensation data are written into IQ chip 6 from data writing circuit terminals 2a to 2d provided on the exterior of container body 1. Thereafter, however not shown here, in order to protect a circuit forming surface of IC chip 6, resin as "underfill" is injected inside second recess 20b and thereby temperature-compensated crystal oscillator is completed.

However, in the above described temperature-compensated crystal oscillator, crystal inspection terminals X1, X2 provided on the bottom of second recess 20b in container body 1 will be covered with IC chip 6 after IC chip 6 has been fixed onto second recess 20b and will also be covered with under-fill resin. Consequently, after completion as a product, oscillation characteristics for crystal unit alone will not be measurable. In that case, even if failure might occur such as oscillation defects and the like in a temperature-compensated crystal oscillator after a product is shipped, for example, oscillation characteristics for the crystal unit alone cannot be analyzed and therefore it is difficult to discover the cause for the oscillation defects.

In addition, if temperature-compensated crystal oscillators are further downsized to, for example, not larger than 3.2×2.5 mm in its footprint, the size of a bottom of recess 20b in container body 1 will also be small so that it will become impossible to form crystal inspection terminals X1, X2 of a sufficient size on the bottom of second recess 20b. Due to a probe of a measuring device for measuring oscillation characteristics, crystal inspection terminals X1, X2 require such a size as not less than 0.6×0.6 mm, for example; however, if temperature-compensated crystal oscillators are further downsized, the crystal inspection terminal will be smaller than this size so that it will be impossible to make definite measurement on oscillation characteristics.

Therefore, also in a temperature-compensated crystal oscillator of two-room type as described above, it is conceivable to arrange crystal inspection terminals on an outer side surface of a container body as implemented in case of a temperature-compensated crystal oscillator of one-room type (see US 2006/0055478A1, for example). In that case, in center layer 1a, conductive paths will be provided to electrically connect to crystal circuit terminals 4×1, 4×2 from the crystal retaining terminals to which crystal blank 8 is fixed through crystal inspection terminals X1, X2 provided on an end face of center layer 1a. In consideration of ongoing downsizing of crystal oscillators, the side surface area of container body 1 will be small and, therefore, it is difficult to provide a total of three terminals, or crystal inspection terminals and data writing terminals, on one exterior surface. Therefore, two data writing terminals may remain on each side surface including a long side of center layer 1a among the side surfaces of container body 1, and crystal inspection terminals may be provided onto respective side surfaces including short sides of center layer 1a among side surfaces of container body 1. FIG. 3 shows terminal arrangement on a back side of center layer 1a in case of thus having formed crystal inspection terminals X1, X2 on both end faces of center layer 1a.

However, when crystal inspection terminals are arranged in this way, and considering the arrangement of IC terminal 7 in IC chip 6 described above, conductive path 5 connecting each of crystal inspection terminals X1, X2 provided on the both end faces in the direction of a long side from crystal circuit terminals 4×1, 4×2 will be long on center layer 1a. This means that line capacitance, stray capacitance and the like in the conductive path directly connected to crystal chip 8 increases, and consequently gives rise to such a problem of complicated design of crystal oscillators or complicated quality management because, for example, oscillating frequency may largely deviate from the designed value.

SUMMARY OF THE INVENTION

An object of the present invention is to provide a surface mount type temperature-compensated crystal oscillator which is small in variation from a designed oscillating frequency value and can be designed easily.

The object of the present invention is attained by a surface mount type temperature-compensated crystal oscillator comprising: a crystal blank; an IC chip integrating therein an oscillation circuit using the crystal blank and a temperature compensation mechanism of compensating frequency temperature characteristics of the crystal blank; and a substantially rectangular parallelepiped container body for surface mounting having a first recess of housing the crystal blank and a second recess of housing the IC chip, wherein the container body has an outside shape in a substantially rectangular having long sides and short sides, a mounting electrode being formed at each corner of an outer bottom surface of the container body; respective side surfaces of the container body corresponding to the long sides are provided with crystal inspection terminals for inspecting oscillation characteristics of a crystal unit composed of the crystal blank; respective side surfaces of the container body corresponding to the short sides are provided with data writing terminals used for writing temperature compensation data to the temperature compensation mechanism; a plurality of circuit terminals are arranged in a row for each of the long sides along the long side in a bottom surface of the second recess, circuit terminals located at opposite ends of the row being electrically connected to the corresponding mounting electrodes, circuit terminals located in a middle portion in the row being at least a crystal circuit terminal and a writing circuit terminal, the crystal circuit terminal being electrically connected to the crystal inspection terminal and the writing circuit-terminal being electrically connected to the data writing terminal; the IC chip comprises a plurality of IC terminals each corresponding to each of the circuit terminals and the respective IC terminals are fixed onto the bottom surface of the second recess by flip chip bonding to connect to corresponding circuit terminals; the crystal blank is hermetically sealed inside the first recess to configure the crystal unit and is electrically connected to the crystal circuit terminals; and a conductive path electrically connecting the crystal inspection terminal with the crystal IC terminal is formed to be shorter than a conductive path electrically connecting the data writing terminal with the writing IC terminal.

In a surface mount type temperature-compensated crystal oscillator according to the present invention, since a side surface of a container body is provided with a crystal inspection terminal together with a data writing terminal, oscillation characteristics of a crystal unit alone can be measured so that analysis on oscillating defects becomes feasible therefore even after a product is shipped. Since the crystal inspection terminal is provided on the side surface along the long side among side surfaces of the container body, a crystal IC terminal of an IC chip and the crystal inspection terminal can be connected with a short conductive path. Accordingly, line capacitance, stray capacitance and the like can be made small, preventing influence onto oscillating frequency and facilitating the design. In that case, although the conductive path from the IC chip to the data writing terminal becomes long, the conductive path is outside the oscillation closed loop of the oscillation circuit and is irrelevant to oscillating operations and, therefore, even if that conductive path might be long, the oscillating frequency is not adversely affected.

DETAILED DESCRIPTION OF THE PREFERRED EMBODIMENTS

Figure 1A:
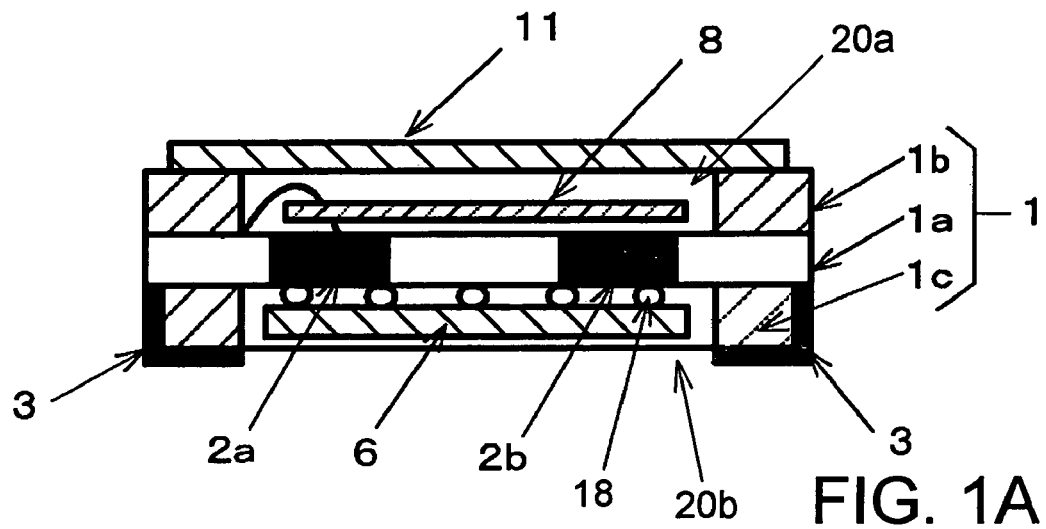
FIG. 1A is a partially sectional front elevation view showing an example of a configuration of a surface mount type conventional temperature-compensated crystal oscillator.
Figure 2A:
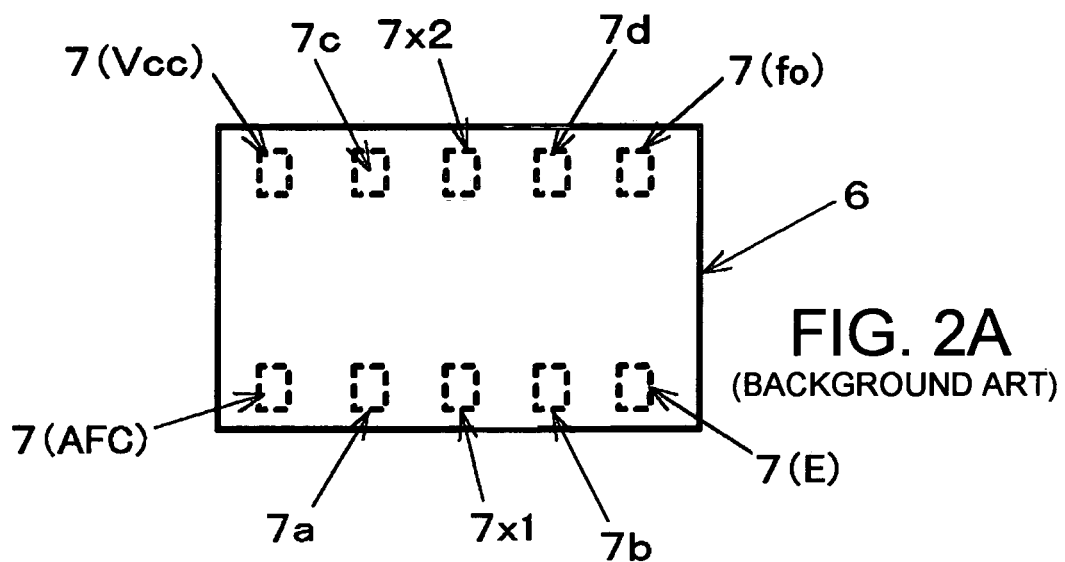
FIG. 2A is a perspective plan view of an IC chip.
Figure 2B:
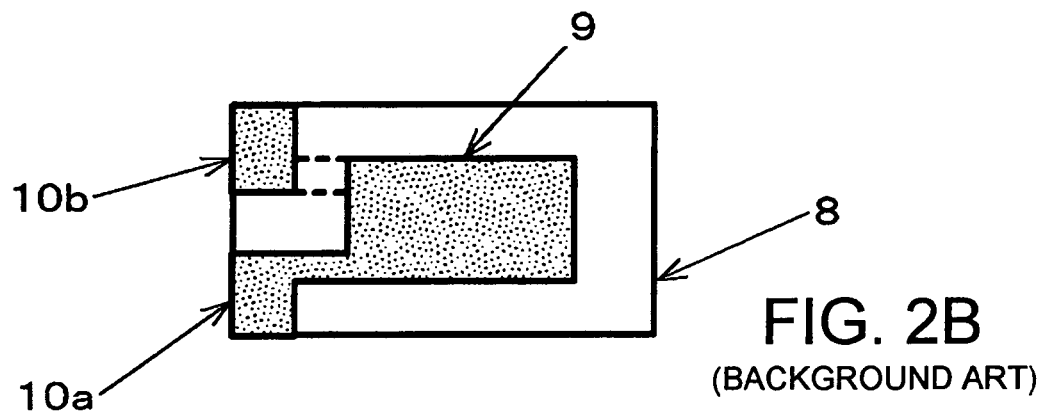
FIG. 2B is a plan view of a crystal chip.
Figure 3:
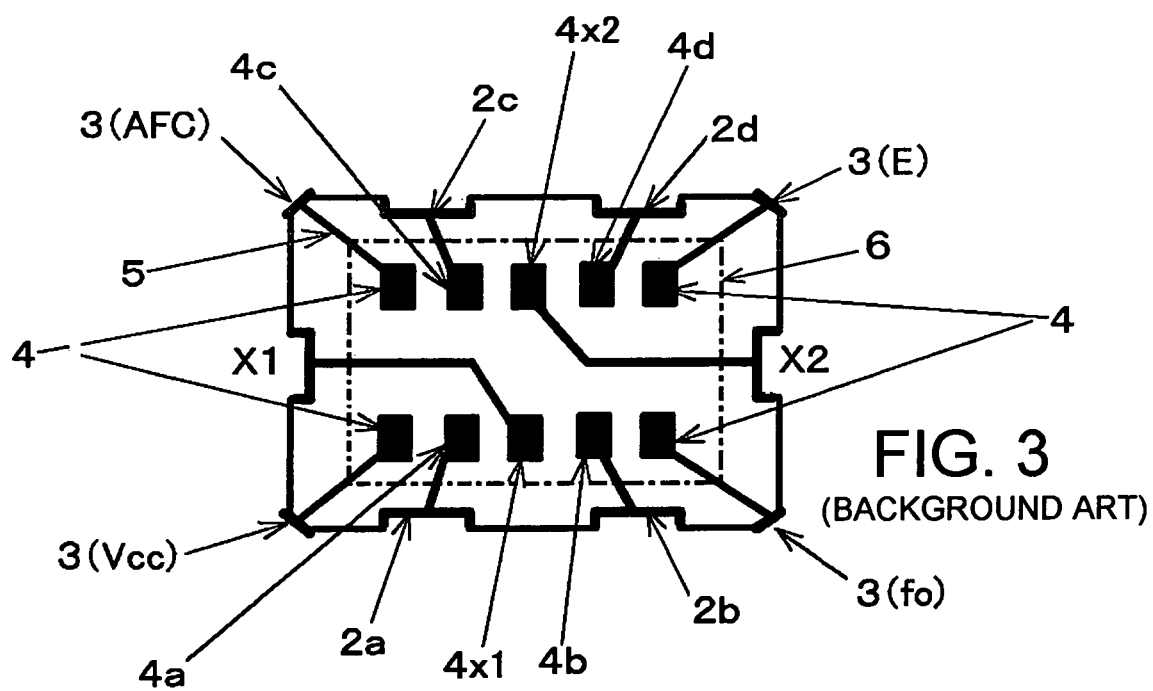
FIG. 3 is a bottom view of the center layer of the container body in a crystal oscillator of another example of a surface mount type conventional temperature-compensated crystal oscillator.

A surface mount type temperature-compensated crystal oscillator according to an embodiment of the present invention is constructed and shaped similar to the one described with FIG. 3 described above; however it is different, in arrangement of a crystal inspection terminal and a data writing terminal, from the one shown in FIG. 3. That is, the crystal oscillator of the present embodiment comprises, as shown in FIG. 1A, container body 1 having a first recess and a second recess, crystal blank 8 hermetically sealed in first recess 1, and IC chip 6 fixed onto a bottom surface of the second recess by flip chip bonding. Container body 1 has a flat, substantially rectangular parallelepiped outside shape having short sides and long sides when mounted on a wiring substrate and viewed from above. In container body 1, four corners of a main face having the second recess are provided with likewise mounting electrodes as described above. IC chip 6 is identical to the one used in the above described crystal oscillator and comprises IC terminals in the same arrangement as shown in FIG. 2A on the circuit forming surface thereof.

Figure 4:
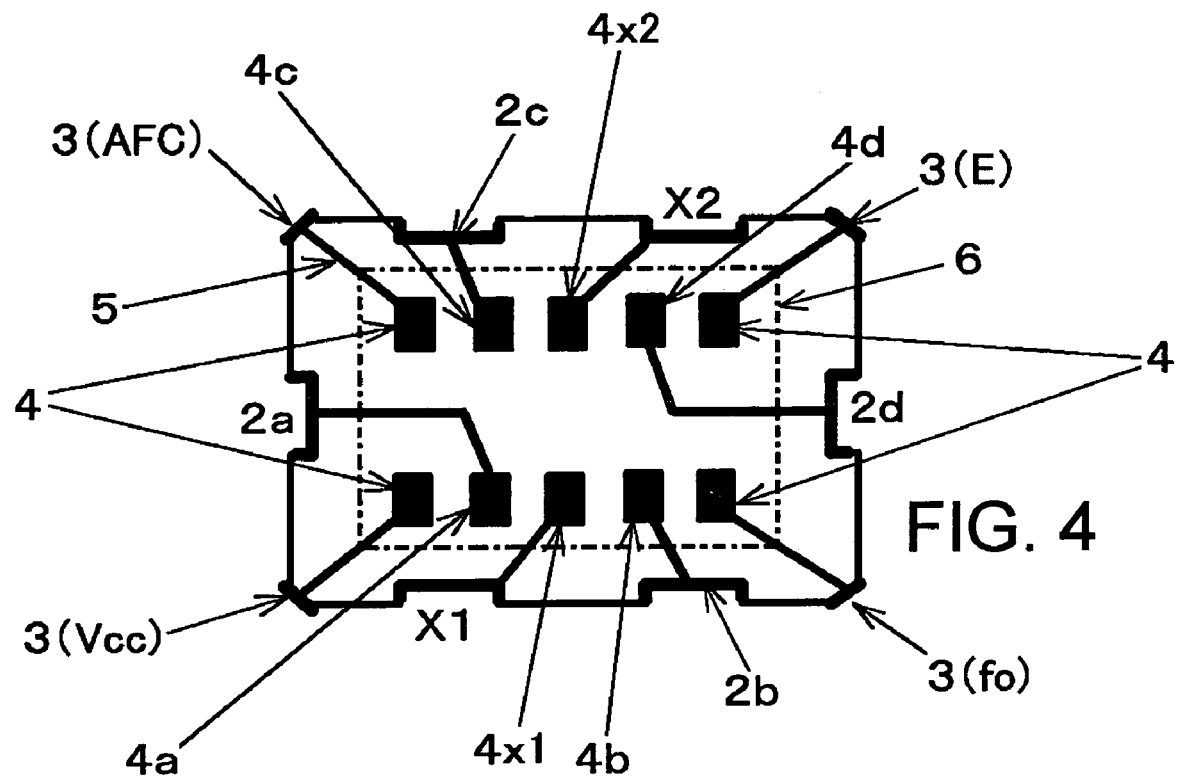
FIG. 4 is a bottom view of the center layer of the container body of a surface mount type temperature-compensated crystal oscillator according to an embodiment of the present invention.

Container body 1 is made of laminated ceramic having center layer 1a and frame walls 1b, 1c similar to the one described above. FIG. 4 is a bottom view of center layer 1a in the crystal oscillator of the present embodiment and shows arrangement of terminals and conductive paths on a side of center layer 1a on where IC chip 6 is fixed. As shown in FIG. 4, the crystal oscillator of the present embodiment is different from the one having been shown in FIG. 3 in arrangement of conductive paths 5 on the side where IC chip 6 is fixed in center layer 1a and is different in arrangement of crystal inspection terminals X1, X2 and data writing terminals 2a to 2d formed on end faces of center layer 1a.

Figure 1B:
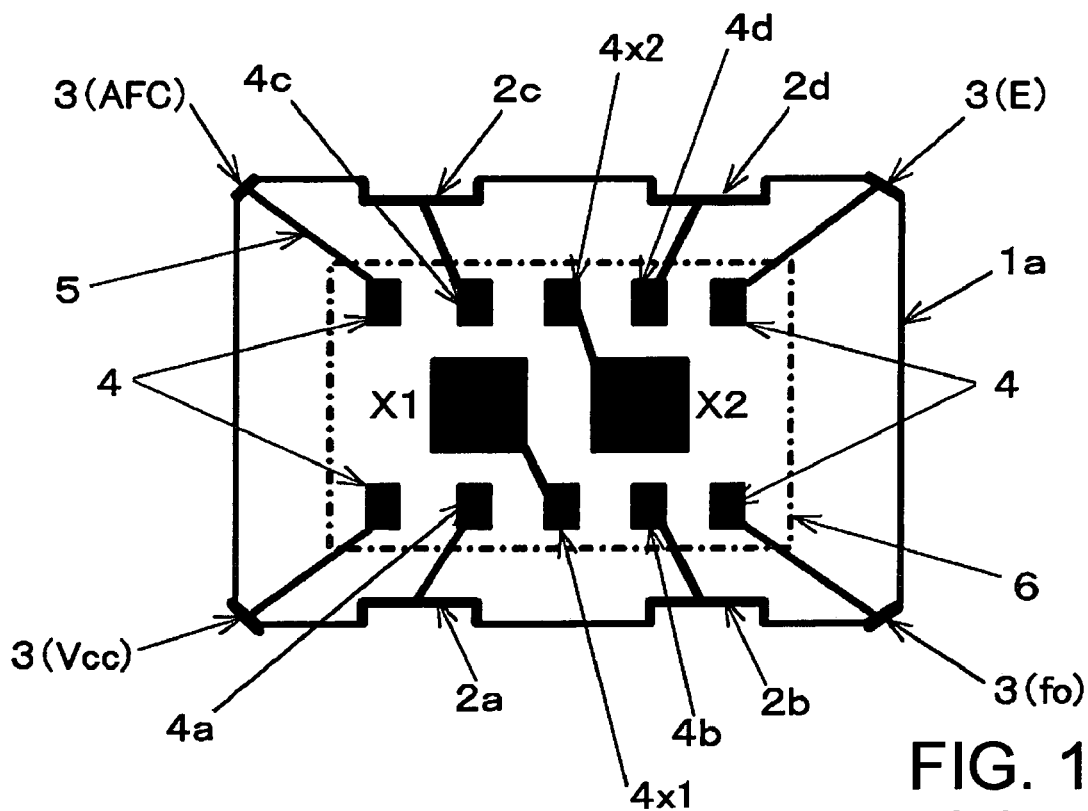
FIG. 1B is a bottom view of a center layer in a container body of the crystal oscillator shown in FIG. 1A.

On the back side of center layer la, five circuit terminals 4 are arranged in a row for each long side, along each long side of center layer 1a. In FIG. 4, dashed-dotted lines show the location where IC chip 6 is arranged, and circuit terminals 4 are to be provided corresponding to IC terminals to be provided in IC chip 6 as described later. Similar to the one shown in FIG. 1B, total of four circuit terminals 4 provided in ends of rows are a power supply terminal, a grounding terminal, an output terminal and an automatic frequency control terminal respectively and are electrically connected to corresponding mounting electrodes 3 by conductive paths 5 each formed in a straight line on center layer 1a. On each row of circuit terminals, the circuit terminals at the center of the rows are crystal circuit terminals 4×1, 4×2 electrically connected to crystal blank 8. For each row of circuit terminals, a second and a fourth circuit terminals of that row are writing circuit terminals 4a to 4d.

The crystal oscillator of the present embodiment is provided with crystal inspection terminal X1 and data writing terminal 2b on an end face along one long side of center layer 1a out of end faces of center layer 1a and is provided with crystal inspection terminal X2 and data writing terminal 2c on an end face along the other long side. Here, crystal inspection terminal X1 and data writing terminal 2c face each other while crystal inspection terminal X2 and data writing terminal 2b face each other. Conductive path 5 shaped in a straight line provided on a back side of center layer 1a connects crystal inspection terminals X1, X2 to crystal circuit terminals 4×1, 4×2, respectively, and connects data writing terminals 2b and 2c to writing circuit terminals 4b, 4c, respectively. In addition, in end faces of center layer 1a, the end face along one short side of center layer 1a is provided with data writing terminal 2a and the end face along the other short side is provided with data writing terminal 2d. Conductive path 5 intervening between the rows of circuit terminals connects data writing terminals 2a, 2d to writing circuit terminals 4a, 4d, respectively.

IC chip 6 is fixed onto a back side of center layer 1a, that is, onto a bottom surface of the second recess of container body by bringing each IC terminal into junction to a corresponding circuit terminal by ultrasonic thermo compression bonding by means of bump 18 similar to the above described case. A crystal blank housed in the first recess of the container body will be electrically connected to an oscillation circuit inside the IC chip through crystal retaining terminals (not shown), crystal circuit terminals and crystal IC terminals. The crystal blank will be electrically connected to crystal inspection terminals X1, X2 as well.

In such a surface mount type temperature-compensated crystal oscillator, crystal inspection terminals X1, X2 will be arranged on an external side of a container body, and therefore, even after completion of a crystal oscillator or after shipment, the oscillation characteristics of the crystal unit alone can be measured and therefore even after shipment and the like, analyses on defects can be carried out. In addition, since crystal inspection terminals are provided on side surfaces of a container, even if crystal oscillators are further downsized, electrode areas of crystal inspection terminals are comparatively readily securable. In particular, the crystal oscillator of the present embodiment is provided with crystal inspection terminals and data writing terminals in a dispersed manner onto four side surfaces of the substantially rectangular parallelepiped container body and therefore the electrode area of each terminal can be made larger easily.

In addition, by providing crystal inspection terminals X1, X2 on a side surface along the long side of the container body and providing at least a pair of data writing terminals 2a, 2d respectively to end faces in the longitudinal direction of the container body, it is possible to make length of a conductive path from crystal IC terminals to crystal inspection terminals X1, X2 shorter than the length of a conductive path from writing IC terminals of the IC chip to data writing terminals 2a and 2d and it is possible to make a conductive path from the IC chip to the crystal inspection terminals the shortest. Therefore, it is possible to reduce line capacitance, stray capacitance and the like of a wiring pattern directly connected to the crystal blank and it is possible to prevent variation in oscillating frequency so that a crystal oscillator can be easily designed. Here, even if a conductive path becomes long between data writing terminals 2a and 2d for writing temperature compensation data and writing IC terminals 7a and 7d of the IC chip, this conductive path is not directly related to the oscillation circuit and, therefore, influences to the oscillating frequency can be ignored.

Figure 5:
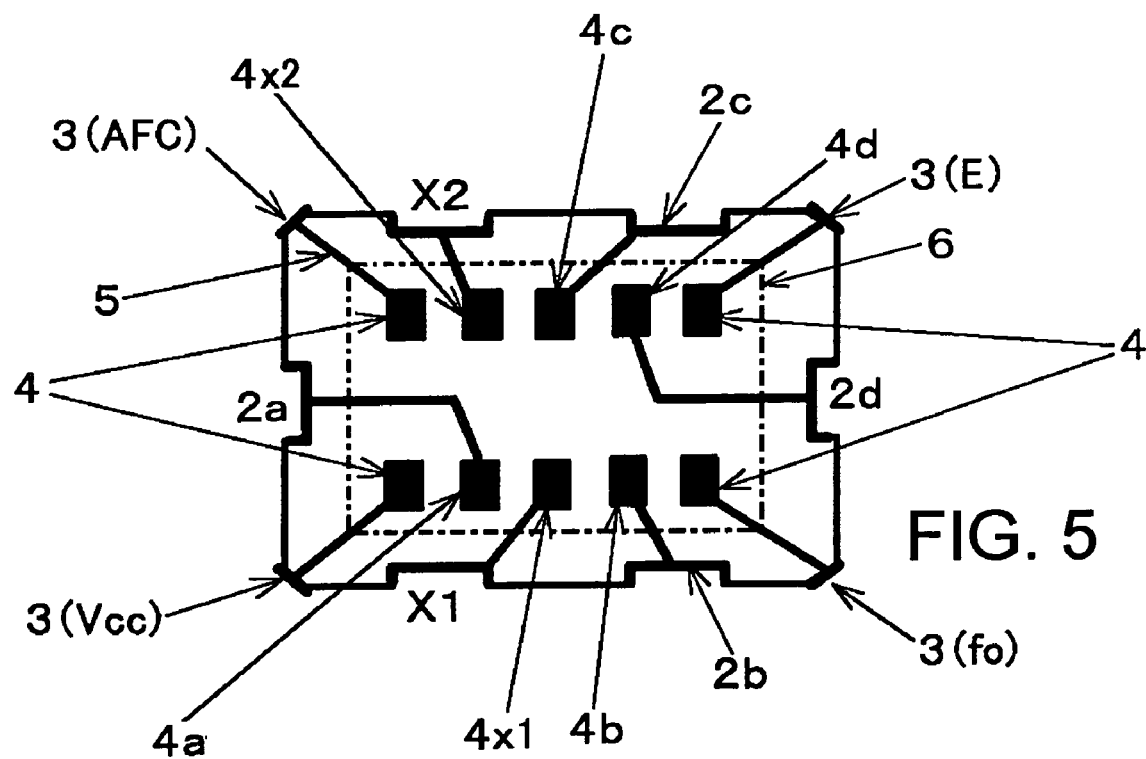
FIG. 5 is a bottom view of the center layer of the container body of a surface mount type temperature-compensated crystal oscillator according to another embodiment of the present invention.

In the crystal oscillator as described with reference to FIG. 4, although crystal inspection terminals X1, X2 are arranged in the mutually orthogonal direction across center layer, it is possible to change the position of a crystal IC terminal in IC chip 6 and correspondingly change the position of a crystal circuit terminal in center layer 1a, as shown in FIG. 5, so that crystal inspection terminals X1, X2 exactly face each other across center layer 1a as well. As shown in FIG. 5, writing IC terminal 7c is interchanged with crystal IC terminal 7×2 in the crystal oscillator as shown in FIG. 4, and correspondingly writing circuit terminal 2c is interchanged with crystal circuit terminal 2×2, so that crystal inspection terminals X1, X2 exactly face each other and data writing terminals 2b, 2c exactly face each other. Such configuration allows a probe of a measuring device to easily contact with crystal inspection terminals X1, X2 so as to improve work efficiency of oscillation examination of the crystal unit.

Although each temperature-compensated crystal oscillator described above is provided with four data writing terminals, similar advantages to the one as described above may be achieved even with a temperature-compensated crystal oscillator having only two data writing terminals, by providing crystal inspection terminals on each of the both side surfaces along the long sides of the container body and providing one data writing terminal each of the both side surfaces along the short sides.

What is claimed is:

1. A surface mount type temperature-compensated crystal oscillator comprising:
   a crystal blank;
   an IC chip integrating therein an oscillation circuit using said crystal blank and a temperature compensation mechanism of compensating frequency temperature characteristics of said crystal blank; and
   a substantially rectangular parallelepiped container body for surface mounting having a first recess of housing said crystal blank and a second recess of housing said IC chip,
   wherein said container body has an outside shape in a substantially rectangular having long sides and short sides, a mounting electrode being formed at each corner of an outer bottom surface of said container body;
   respective side surfaces of said container body corresponding to said long sides are provided with crystal inspection terminals for inspecting oscillation characteristics of a crystal unit composed of said crystal blank;
   respective side surfaces of said container body corresponding to said short sides are provided with data writing terminals used for writing temperature compensation data to said temperature compensation mechanism;
   a plurality of circuit terminals are arranged in a row for each of said long sides along the long side in a bottom surface of said second recess, circuit terminals located at opposite ends of said row being electrically connected to said corresponding mounting electrodes, circuit terminals located in a middle portion in said row being at least a crystal circuit terminal and a writing circuit terminal, said crystal circuit terminal being electrically connected to said crystal inspection terminal and said writing circuit terminal being electrically connected to said data writing terminal;

said IC chip comprises a plurality of IC terminals each corresponding to each of said circuit terminals and said respective IC terminals are fixed onto the bottom surface of said second recess by flip chip bonding to connect to corresponding circuit terminals;

said crystal blank is hermetically sealed inside said first recess to configure the crystal unit and is electrically connected to said crystal circuit terminals; and a conductive path electrically connecting said crystal inspection terminal with said crystal IC terminal is formed to be shorter than a conductive path electrically connecting said data writing terminal with said writing IC terminal.

2. The crystal oscillator according to claim 1, wherein said circuit terminal includes an additional writing circuit terminal; said side surface corresponding to said long side of said container body is provided with an additional data writing terminal; and said additional writing circuit terminal and said additional data writing terminal are electrically connected to each other by a conductive path.

3. The crystal oscillator according to claim 1, wherein
said container body consists of a laminated ceramic consisting of a substantially rectangular center layer and a first and a second frame walls respectively laminated to an upper and lower side of the center layer to form said first and second recesses; and said respective circuit terminal and said conductive path are formed on a front side of said center layer and said crystal inspection terminals and said data writing terminal are formed on an end face of said center layer.

* * * * *